United States Patent [19]
Nguyen

[11] Patent Number: 5,486,777
[45] Date of Patent: Jan. 23, 1996

[54] LOW POWER DIFFERENTIAL RECEIVER INPUT CIRCUIT

[75] Inventor: Hai T. Nguyen, San Jose, Calif.

[73] Assignee: National Semiconductor Corporation, Santa Clara, Calif.

[21] Appl. No.: 301,462

[22] Filed: Sep. 7, 1994

[51] Int. Cl.⁶ .................. H03K 19/0185; H03K 19/0948
[52] U.S. Cl. .................. 326/68; 326/83; 327/203
[58] Field of Search .................. 326/83, 21, 68, 326/86; 327/202, 203, 222, 225, 215, 217–218, 221; 365/156

[56]  References Cited

U.S. PATENT DOCUMENTS

| 3,763,384 | 10/1973 | Stutz | 327/221 |
| 3,982,196 | 9/1976 | Poujouis | 327/222 |
| 4,785,299 | 11/1988 | Trumpp | 327/215 |
| 4,809,226 | 2/1989 | Ochoa, Jr. | 365/156 |
| 4,890,010 | 12/1989 | Neudeck et al. | 326/86 |
| 5,140,179 | 8/1992 | Takano | 327/203 |
| 5,173,870 | 12/1992 | Sukashita et al. | 327/215 |

Primary Examiner—Edward P. Westin
Assistant Examiner—Jon Santamauro
Attorney, Agent, or Firm—Skjerven, Morrill, MacPherson, Franklin & Friel; Paul J. Winters; Patrick T. Bever

[57] ABSTRACT

A low power differential receiver input stage using n-channel/p-channel transistor pairs to adjust the voltage levels of differential output signals. A first n-channel/p-channel transistor pair is connected to a first output terminal and a second n-channel/p-channel transistor pair is connected to a second output terminal. First and second differential signals respectively applied to first and second input terminals are passed to the first and second output terminals through first and second resistors, respectively. The first differential signal is applied to the gates of the second n-channel/p-channel transistor pair, thereby adjusting the voltage level at the second output terminal. Similarly, the second differential signal is applied to the gates of the first n-channel/p-channel transistor pair, thereby adjusting the voltage level at the first output terminal.

12 Claims, 3 Drawing Sheets

LOW POWER DIFFERENTIAL RECEIVER INPUT CIRCUIT

BACKGROUND

1. Field of the Invention

The present invention is generally related to interface circuits and more particularly to receiver input circuits for receiving differential digital signals.

2. Description of the Prior Art

Interface circuits facilitate the serial or parallel transmission of digital information between a transmission source, such as a computer, and a transmission destination, such as a modem, a printer or another computer. Interface circuits include transmission line drivers, which convert data signals of a first form (e.g., TTL) into RS (recommended standard) signals which are transmitted on data transmission lines, and receivers, which convert the RS signals into data signals acceptable to a designated device (e.g., TTL).

Interface circuits are typically designed to meet one of several interface standards including the following commonly-known types: RS-232 (EIA/TIA-232-E, adopted in 1991), RS-423 (EIA RS-423-A, adopted in 1978), RS-422 (TIA/EIA-422-B, adopted in 1994) and RS485 (EIA RS-485, adopted in 1983). Each of these interface standards define signal and load parameters such that data signals generated by a line driver circuit can be successfully received and converted by a receiver circuit, provided both the line driver circuit and the receiver circuit meet the same interface standard.

The oldest interface standard is RS-232 which supports one-way communications between a single transmission source and a single transmission destination separated by a maximum distance of 15 meters. Bit transmission is limited to 20K bits/second, and is based on a single-ended transmission signal transmission levels of +5 to +15 volts represent logic LOW signals, and transmission levels of −5 to −15 volts represent logic HIGH signals. However, as the interaction between computers and peripherals has grown more complex, use of the RS-232 standard has become limited due to its low transmission rate and lack of flexibility.

The RS-423 standard was adopted to provide faster and more flexible data transmission in applications which are beyond the capability of the RS-232 standard. The RS-423 standard supports bit transmission rate of 100K bits/second and transmissions lengths of up to 1200 meters. Further, the RS-423 standard allows simultaneous transmission from one transmitter circuit to as many as 10 receiver circuits. However, similar to the RS-232 standard, the RS-423 standard uses a single-ended transmission signal, thereby limiting its bit transmission rate.

The RS-422 and RS-485 standards were developed to overcome the limited bit transmission rate of the RS-232 and RS-423 standards. Instead of single-ended transmission signals, the RS-422 and RS-485 standards employ differential-mode signals-first and second differential signals having a common mode voltage level and differing by an offset voltage. By using the differential-mode signals, the maximum bit transmission rate for these standards is 10M bits/second (over short distances), and these signals can be transmitted up to 1200 meters (at low data transmission rates). Under the RS-422 and RS-485 standards, the differential signals received at input terminals of a receiver circuit must differ by 200 mV or more, and may vary across a common mode voltage of −7 V to +12 V. For example, if the first input signal is +10 V, then the second input voltage must be greater than 10.2 V, or less than 9.8 V.

The RS-422 differs from the RS-485 standard in that the RS-422 is limited to a single transmission source connected to ten receiver circuits, whereas the RS-485 standard allows the connection of 32 transmission sources and 32 transmission destinations, thereby allowing multi-point data communication.

FIG. 4 shows a simplified RS-485 receiver circuit 400 including input terminals IN1 and IN2 which receive differential input signals from an RS-485 transmitter circuit (not shown). The input terminals IN1 and IN2 are respectively connected to output terminals OUT1 and OUT2 through resistors RA1 (for example 80KΩ) and RA2 (for example 80KΩ), respectively. A voltage regulator 401 applies a reference voltage VREF to output terminals OUT1 and OUT2 through resistors RB1 (for example 20KΩ) and RB2 (for example 20KΩ), respectively. It is noted that the resistor values of resistors RA1, RA2, RB1 and RB2 are selected to correspond with resistor values used in the disclosed RS-485 embodiment of the present invention (discussed below).

To meet the requirements of the RS-485 standard, voltage regulator 401 is required to provide a stabilized reference voltage VREF of 2.5 V over a wide range of common mode input voltages (as mentioned above, under the RS-485 standard, the input voltages range from −7 V to +12 V). To meet this stabilized voltage requirement, it is necessary that Icc of voltage regulator 401 exceeds two times the maximum input current applied to input terminals IN1 and IN2. When the voltage at input terminal IN1 is 12 volts, and the voltage at input terminal IN2 is assumed to be approximately 12 volts, noting that RA1+RA2=RB1+RB2=100KΩ, then the current at input terminals IN1 or IN2 approximately equals (12 V−2.5 V)/100KΩ=95 μA. Therefore, Icc of voltage regulator 401 must be greater than two times 95 μA, or greater than 190 μA. It is noted that this Itc cannot be reduced even if the input signal is less than 12 V. As such, a large amount of power is consumed by the prior art receiver input circuit.

SUMMARY

The present invention is directed to a differential receiver input stage which substantially reduces power consumption over the prior art by eliminating the need for a voltage regulator, thereby reducing the required operating current.

A low power differential receiver circuit produced in accordance with the present invention uses a first differential input signal received at a first input terminal to control a second differential output signal transmitted by the second output terminal, and a second differential input signal received at the second input terminal to control a first differential output signal transmitted by the first output terminal. The first output signal is controlled through a first n-channel transistor and a first p-channel transistor, wherein the drains of the first n-channel and p-channel transistors are connected to the first output terminal through resistors, the sources of the first n-channel and p-channel transistors are connected to first and second voltage sources, respectively, and the gates of the first n-channel and p-channel transistors are connected to the second differential input signal. Similarly, the second output signal is controlled through a second n-channel transistor and a second p-channel transistor, wherein the drains of the second n-channel and p-channel transistors are connected to the second output terminal through resistors, the sources of the second n-channel and p-channel transistors are connected to the first and second voltage sources, respectively, and the gates of the second n-channel and p-channel transistors are connected to the first differential input signal. With this arrangement, the first and second differential input signals may be attenuated and transmitted to a subsequent receiver stage via the first and second output terminals without losing the differential relationship between the signals, and without requiring a reference voltage which produces high system currents resulting in high power dissipation.

DESCRIPTION OF THE DRAWINGS

These and other features, aspects, and advantages of the present invention will become better understood with regard to the following description, appended claims, and accompanying drawings, where:

DETAILED DESCRIPTION

First Embodiment

Figure 1:
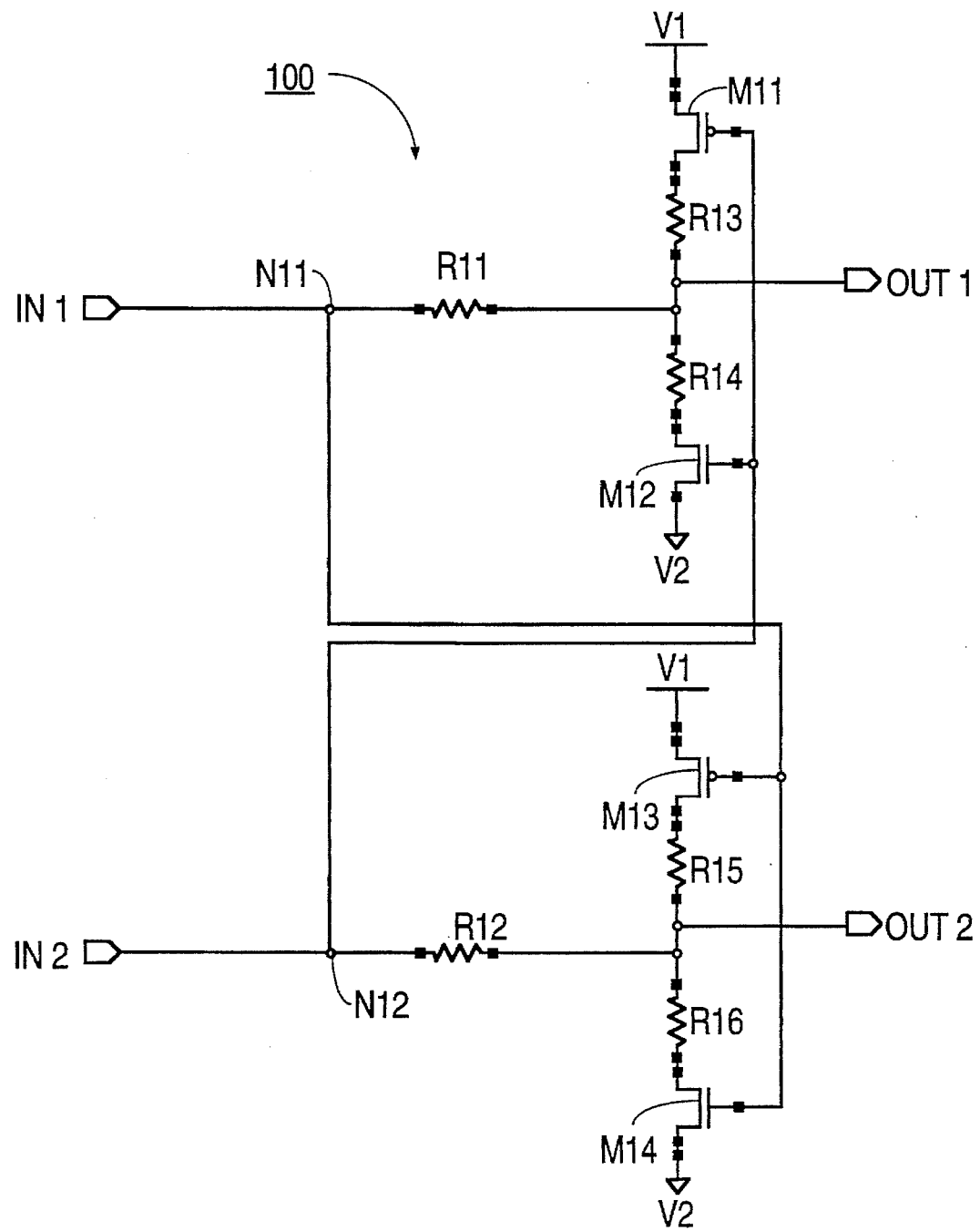
FIG. 1 shows a first low power differential receiver circuit in accordance with the present invention.

FIG. 1 shows a first low power differential receiver input stage 100 in accordance with the present invention.

The receiver input stage 100 includes first and second input terminals IN1 and IN2 for receiving differential-mode input signals generated by a transmitting circuit (not shown). Differential output signals are attenuated by the receiver input stage 100 and are transmitted on first and second output terminals OUT1 and OUT2.

As shown in FIG. 1, the receiver input stage 100 includes a first transistor pair (M11 and M12) connected to the first output stage OUT1, and a second transistor pair (M13 and M14) connected to the second output stage OUT2. The input terminal IN1 is connected to a first node N11, which in turn is connected to the first output terminal OUT1 through a resistor R11. Similarly, the second input terminal IN2 is connected to a second node N12, which is connected to the second output terminal OUT2 through a resistor R12. In addition, first output terminal OUT1 is connected to the drain of the first p-channel MOSFET M11 through a resistor R13, and is connected to the drain of the first n-channel MOSFET M12 through a resistor R14. The source of first p-channel MOSFET M11 is connected to a first voltage source V1 and the source of first n-channel MOSFET M12 is connected to a second voltage source V2. It is noted that the resistors R13 and R14 may be omitted in certain applications. The gate of the first p-channel MOSFET M11 and the gate of the first n-channel MOSFET M12 are connected to the second node N12, thereby being controlled in part by the voltage at N12. Similarly, the second output terminal OUT2 is connected to the drain of the second p-channel MOSFET M13 through a resistor R15 and to the drain of the second n-channel MOSFET M14 through a resistor R16. The source of the second p-channel MOSFET M13 is connected to V1, and the source of the second n-channel MOSFET M14 is connected to V2. Finally, the gate of the second p-channel MOSFET M13 and the gate of the second n-channel MOSFET M14 are connected to the first node N11, thereby being controlled in part by the voltage at N11.

In operation, a first differential input signal received at the first input terminal IN1 of the low power differential receiver input stage 100 is used to control a second differential output signal produced at the second output terminal OUT2 by controlling the conductive state of the transistor pair M13 and M14. Similarly, a second differential input signal received at the second input terminal IN2 is used to control a first differential output signal produced at the first output terminal OUT1 by controlling the conductive state of the transistor pair M11 and M12. With this arrangement, the first and second differential input signals may be attenuated and transmitted to a subsequent receiver stage without losing the differential relationship between the signals.

It is noted that the receiver input stage 100 may be incorporated into a larger receiver circuit. Therefore, it is understood that the input terminals IN1 and IN2, and the output terminals OUT1 and OUT2 are not necessarily embodied by actual terminal structures, but may represent electrical connections between the receiver input stage 100 and adjoining circuitry.

Second Embodiment

Figure 2:
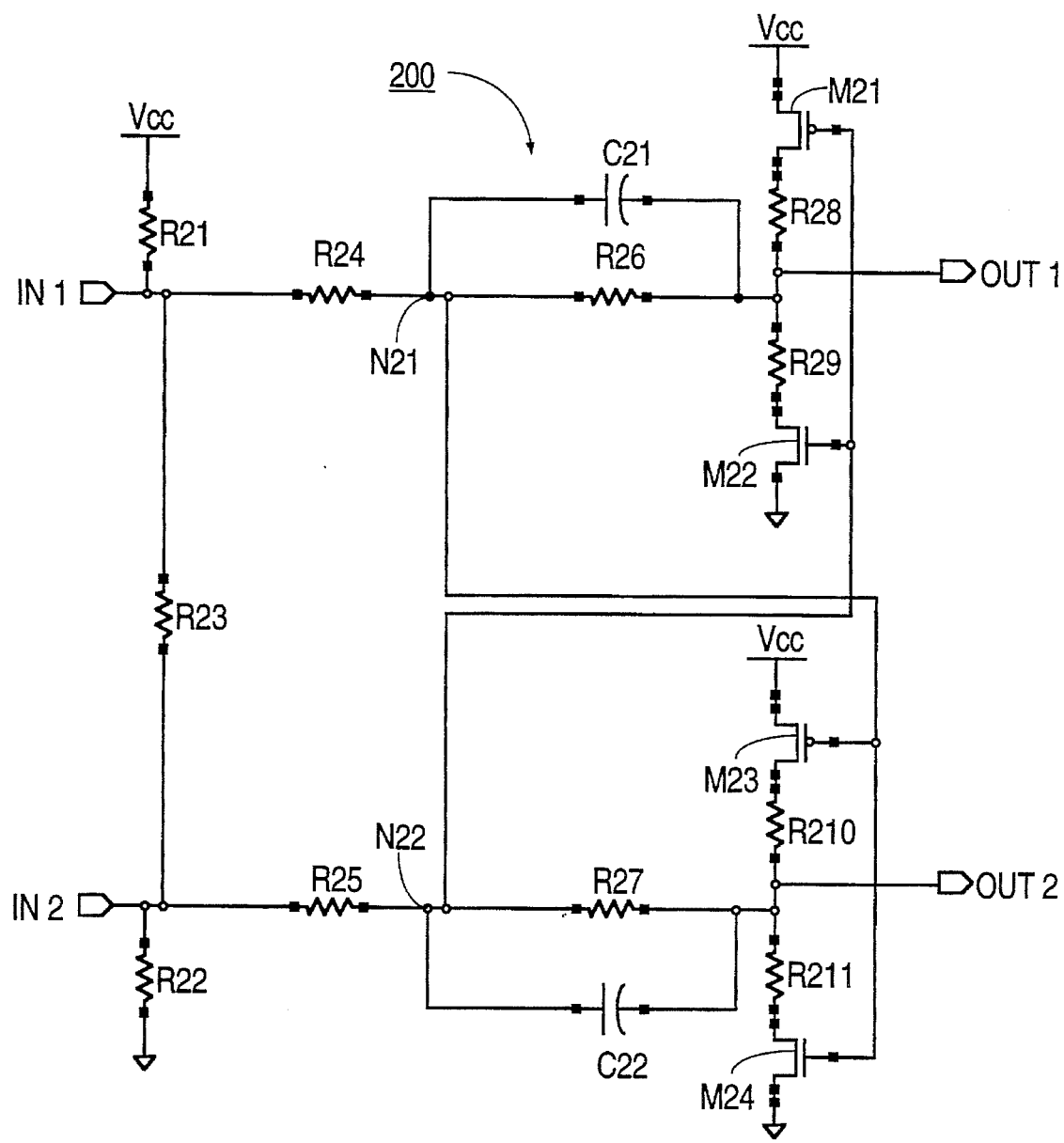
FIG. 2 shows a second low power differential receiver circuit incorporating the present invention.

FIG. 2 shows a second low power differential receiver input circuit 200 in accordance with the present invention. The receiver input circuit 200 includes first and second input terminals IN1 and IN2 for receiving differential-mode input signals generated by a transmitting circuit (not shown). The differential-mode input signals have a common mode voltage and a differential voltage. Differential output signals from the circuit 200 are transmitted on first and second output terminals OUT1 and OUT2, which drive a following stage (not shown) of an interface receiver circuit using, for example, a 5 V rail.

As shown in FIG. 2, the first input signal on input terminal IN1 is biased by a connection to Vcc through a resistor R21. Similarly, the second input signal received on input terminal IN2 is biased by a connection to ground through a resistor R22. The connections to Vcc and ground may be omitted in certain embodiments of the present invention. First input terminal IN1 and second input terminal IN2 are also connected together through a third resistor R23. Input terminal IN1 is connected to a first node N21 through a resistor R24. Similarly, second input terminal IN2 is connected to a second node N22 through a resistor R25. The function of resistors R24 and R25 is to limit voltage levels at the nodes N21 and N22, thereby preventing damage to the transistor pairs (discussed below). First node N21 is connected to a first output terminal OUT1 through a resistor R26 which is connected in parallel with a capacitor C21. Similarly, second node N22 is connected to a second output terminal OUT2 through a resistor R27 and capacitor C22, resistor R27 and capacitor C22 being connected in parallel. The capacitors C21 and C22 are used for AC performance and increase the transmission speed of signals, but may be omitted in many other embodiments of the present invention.

The signal levels at output terminals OUT1 and OUT2 are respectively controlled by a first transistor pair (M21 and M22) and a second transistor pair (M23 and M24). The first transistor pair is controlled by the voltage level at node N22, and the second transistor pair is controlled by the voltage level at node N21. More specifically, the first output terminal OUT1 is connected to the drain of a first p-channel MOSFET M21 through a resistor R28, and is connected to the drain of a first n-channel MOSFET M22 through a resistor R29. The source of MOSFET M21 is connected to Vcc and the source of MOSFET M22 is connected to ground. The gate of MOSFET M21 and the gate of MOSFET M22 are connected to the second node N22. Similarly, the second output terminal OUT2 is connected to the drain of a second p-channel MOSFET M23 through a resistor R210, and to the drain of a second n-channel MOSFET M24 through a resistor R211. The source of MOSFET M23 is connected to Vcc, and the source of MOSFET M24 is connected to ground. Finally, the gate of MOSFET M23 and the gate of MOSFET M24 are connected to the first node N21. Thus, the voltage at first node N21 adjusts the voltage level at second output terminals OUT2 by controlling the conductivity of MOSFETs M23 and M24. Similarly, the voltage at second node N22 adjusts the voltage level at first output terminal OUT1 by controlling the conduction of MOSFETs M21 and M22.

RS-485 Embodiment

In one embodiment of the present invention, the circuit 200 is configured to receive signals under the RS-485 standard. In this RS-485 embodiment, Vcc is 5.0 V, resistors R21 and R22 are preferably 200 KΩ, resistor R23 is 300 KΩ, resistors R24 and R25 are 15 KΩ, resistors R26 and R27 are 60 KΩ, resistors R28 and R210 are 21 KΩ, and resistors R29 and R211 are 32 KΩ. Further, p-channel transistors M21 and M23 preferably have channel length-to-width ratios of approximately 75/7, and n-channel transistors M22 and M24 have channel length-to-width ratios of 25/7. Of course, these Vcc, resistor and transistor values may be changed in proportion to each other.

It is noted that the resistive values of resistors R24, R25, R26 and R27 roughly correspond with resistors RA1, RA2, RB1 and RB2 of the prior art receiver input circuit 400 (discussed above). As such, the resistive load present in the receiver input circuit 200 is similar to that present in the prior art receiver input circuit 400, thereby enabling a comparison of the current/power characteristics between a circuit prepared in accordance with the present invention and a prior art receiver input circuit using a voltage generator to produce a reference voltage.

During operation of the receiver input circuit 200, when both input terminals IN1 and IN2 are floating, the resulting voltage at first node N21 is slightly below Vcc and a voltage at second node N22 is slightly above ground (for example, using the Vcc and resistor values for the RS-485 embodiment, the voltage at first node N21 would be 4.36 V, and the voltage at second node N22 would be 0.7 V). In this condition, transistors M21 and M24 are turned on while transistors M22 and M23 are turned off.

Figure 3A:
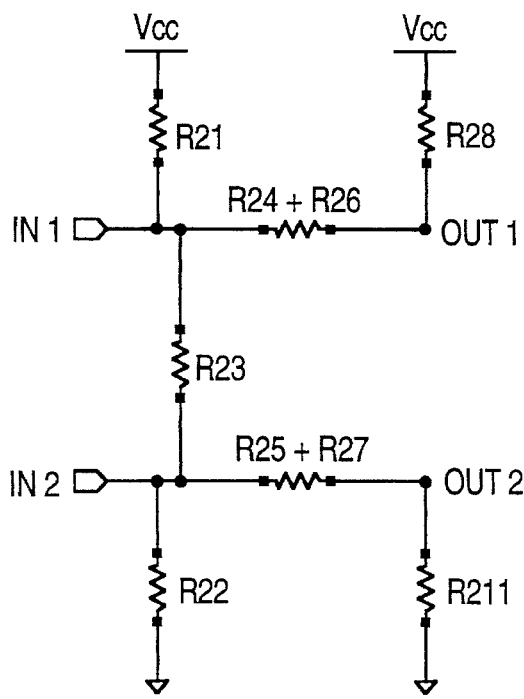
FIG. 3(A) shows an equivalent receiver circuit to the low power differential receiver circuit of FIG. 2 when input terminals are floating.
Figure 3B:
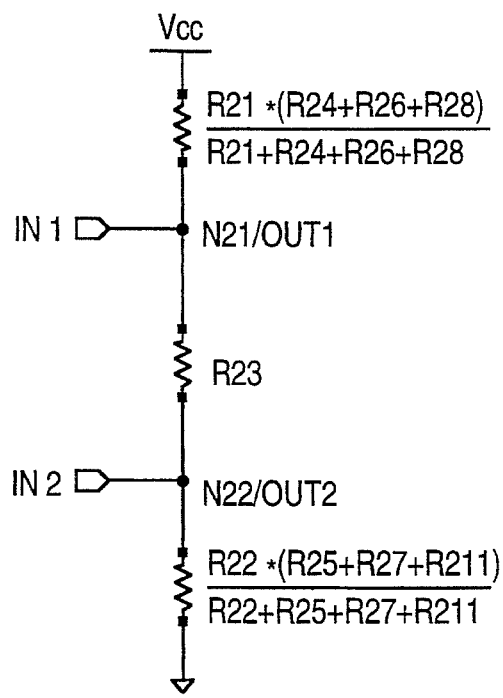
FIG. 3(B) shows a simplified version of the equivalent receiver circuit of FIG. 3(A)
Figure 4:
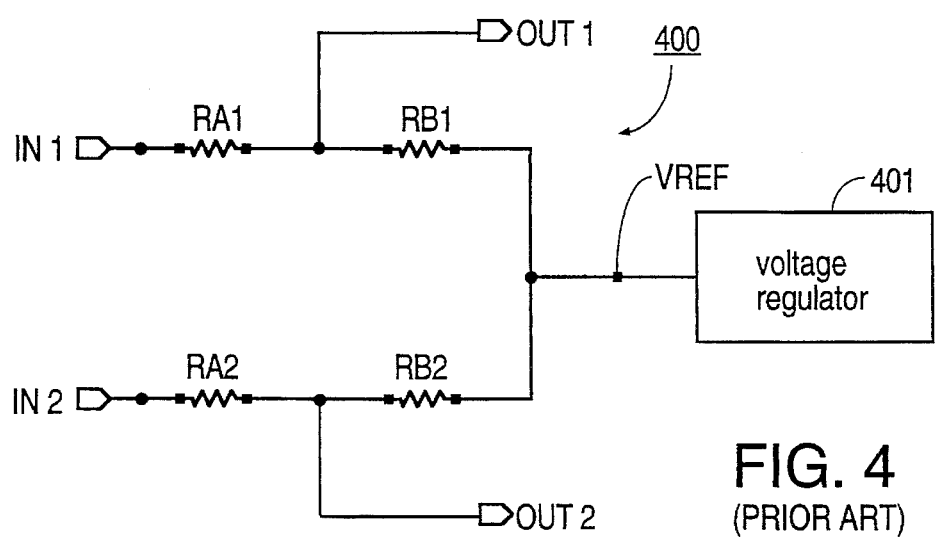
FIG. 4 shows a prior art receiver circuit meeting the RS-485 serial interface standard.

FIGS. 3(A) and 3(B) show a resulting equivalent circuit when both input terminals IN1 and IN2 are floating. As shown in FIG. 3(A), with transistor M21 on and transistor M22 off, circuit 200 may be represented by resistor R21 connected in parallel with resistors R24, R26 and R28 to Vcc. Similarly, with transistor M23 off and transistor M24 on, the circuit may be simplified as resistor R22 connected in parallel with resistors R25, R27 and R211 to ground. As shown in FIG. 3(B), the resulting circuit simplifies to a single resistive load connected between Vcc and N21/OUT1 having a resistance value of R21,(R24+R26+ R28)/(R21+R24+R26+R28). Using the resistance values provided above, this resistive load becomes 65 KΩ. In addition, a single resistive load is shown between node N22/OUT2 and ground which is equal to R22,(R25+R27+ R211)/(R22+R25+R27+R211). Using the resistance values provided above, this resistive load becomes 68.7 KΩ. Finally, nodes N21/OUT1 are connected to nodes N22/OUT2 through resistor R23 (300 KΩ). Using the Vcc of 5 V, the total current through the circuit 200 in this example becomes 5 V/(65 KΩ+300 KΩ+68.7 KΩ), or approximately 12 μA.

As pointed out in the above example, the resulting maximum Icc through the equivalent resistive circuits shown in FIGS. 3(A) and 3(B) is approximately 12 μA. This maximum Icc is substantially less than one-tenth of the Icc present in the prior art receiver circuit 400 (i.e., 190 μA). That is, a receiver input circuit in accordance with the present invention eliminates the need for a reference voltage, as used in the prior art, thereby substantially reducing the maximum Icc. This substantially reduced maximum Icc results in lower power consumption than that present in prior art receiver circuits.

Although the present invention has been described in considerable detail with reference to low power differential receiver input circuits, other versions are possible. For example, the present invention may be incorporated into RS-422 or other receiver circuitry with the same beneficial effect of reducing Icc and thereby reducing power dissipation. Therefore, the spirit and scope of the appended claims should not be limited to the description of the preferred circuits contained herein.

I claim:

1. A low power differential receiver input circuit for convertinq first and second differential input signals respectively having first and second voltage levels into first and second differential output siqnals respectively having third and fourth voltaqe levels, the receiver circuit comprising:

first and second input terminals for respectively receiving the first and second differential input signals;

first and second output terminals for respectively transmitting the first and second differential output signals;

a first resistor connected between the first input terminal and the first output terminal;

a second resistor connected between the second input terminal and the second output terminal;

a first p-channel MOSFET having a drain connected to the first output terminal;

a first n-channel MOSFET having a drain connected to the first output terminal;

a second p-channel MOSFET having a drain connected to the second output terminal; and a second n-channel MOSFET having a drain connected to the second output terminal;

wherein the first input terminal is connected to a gate of the second p-channel MOSFET and to a gate of the second n-channel MOSFET such that the first voltage level controls conductivities of the second p-channel MOSFET and the second n-channel MOSFET thereby producing the second differential output signal at the second output terminal; and wherein the second input terminal is connected to a gate of the first p-channel MOSFET and to a gate of the first n-channel MOSFET such that the. second voltage of the second differential input signal controls the first p-channel MOSFET and the first n-channel MOSFET thereby producing the first differential output signal at the first output terminal.

2. An low power differential receiver circuit of claim 1, wherein:
the drain of the first p-channel transistor is connected to the first output terminal through a third resistor;
the drain of the first n-channel transistor is connected to the first output terminal through a fourth resistor;
the drain of the second p-channel transistor is connected to the second output terminal through a fifth resistor; and
the drain of the second n-channel transistor is connected to the second output terminal through a sixth resistor.

3. A low power differential receiver circuit for respectively converting first and second differential input signals into first and second differential output signals, the receiver circuit comprising:
first and second input terminals for respectively receiving the first and second differential input signals, the first and second input terminals being respectively connected to first and second nodes;
a first output terminal connected to the first node through a first resistor;
a second output terminal connected to the second node through a second resistor;
a first transistor of a first type having a gate connected to the second node, a source connected to a first voltage source and a drain connected to the first output terminal;
a second transistor of a second type having a gate connected to the second node, a drain connected to the first output terminal and a source connected to a second voltage source;
a third transistor of the first type having a gate connected directly to the first node, a source connected to the first voltage source and a drain connected to the second output terminal; and
a fourth transistor of the second type having a gate connected directly to the first node, a drain connected to the second output terminal and a source connected to the second voltage source;
wherein a voltage of the first differential input signal controls the third transistor of the first type and the fourth transistor of the second type, thereby producing the second differential output signal at the second output terminal; and
wherein a voltage of the second differential input signal controls the first transistor of the first type and the second transistor of the second type thereby producing the first differential output signal at the first output terminal.

4. An low power differential receiver circuit of claim 3, further comprising a third resistor connected between the first and second input terminals.

5. An low power differential receiver circuit of claim 4, wherein the first input terminal is connected to a first voltage source, and the second input terminal is connected to a second voltage.

6. An low power differential receiver circuit of claim 5, wherein:
the drain of the first transistor is connected to the first output terminal through a fourth resistor;
the drain of the second transistor is connected to the first output terminal through a fifth resistor;
the drain of the third transistor is connected to the second output terminal through a sixth resistor; and
the drain of the fourth transistor is connected to the second output terminal through a seventh resistor.

7. An low power differential receiver circuit of claim 6 further comprising:
an eighth resistor connected between the first node and the first input terminal; and
a ninth resistor connected between the second node and the second input terminal.

8. An low power differential receiver circuit of claim 7 further comprising:
a first capacitor connected in parallel with the first resistor; and
a second capacitor connected in parallel with the second resistor.

9. An low power differential receiver circuit of claim 8 further comprising:
a tenth resistor connected between the first voltage source and the first input terminal; and
an eleventh resistor connected between the second voltage source and the second input terminal.

10. A method for converting first and second differential input signals transmitted on first and second transmission lines from first and second levels, respectively to third and fourth levels, respectively, the method comprising:
receiving the first and second differential input signals on first and second input terminals, respectively;
passing an attenuated portion of the first differential input signal to a first output terminal;
passing an attenuated portion of the second differential input signal to a second output terminal;
adjusting the attenuated portion of the first differential input signal to the third level by connecting the first output terminal to a first voltage source through a first MOSFET and to a second voltage source through a second MOSFET, and by controlling the conductivity of the first and second MOSFETs using the second differential input signal; and
adjusting the attenuated portion of the second differential input signal to the fourth level by connecting the second output terminal to the first voltage source through a third MOSFET and to the second voltage source through a fourth MOSFET, and by controlling the conductivity of the third and fourth MOSFETs using the first differential input signal.

11. The method of claim 10 further comprising:
biasing the first differential signal by connecting the first input terminal to the first voltage source through a first resistor; and
biasing the second differential signal by connecting the second input terminal to the second voltage source through a second resistor.

12. The method of claim 11 further comprising:
connecting third resistor between the first and second input terminals.

\* \* \* \* \*

UNITED STATES PATENT AND TRADEMARK OFFICE
CERTIFICATE OF CORRECTION

PATENT NO.   :   5,486,777
DATED        :   Jan. 23, 1996
INVENTOR(S)  :   Hai T. Nguyen It is certified that error appears in the above-identified patent and that said Letters Patent is hereby corrected as shown below:

Col. 2, line 38, delete "Itc" and insert --Icc--.

Col. 6, line 1, delete "R21," and insert --R21*--.

Col. 6, line 5, delete "R22," and insert --R22*--.

Col. 6, line 9, delete "Kfi" and insert --KΩ--.

Col. 6, line 34, Claim 1, delete "convertinq" and insert --converting--.

Col. 6, line 37, Claim 1, delete "voltaqe" and insert --voltage--.

Col. 7, lines 3, 54, 57, 61, delete "An" and insert --A--.

Col. 8, lines 8, 14, 21, delete "An" and insert --A--.

Signed and Sealed this

Twentieth Day of August, 1996

Attest:

BRUCE LEHMAN

Attesting Officer        Commissioner of Patents and Trademarks